United States Patent [19]

Borner et al.

[11] 3,941,945

[45] Mar. 2, 1976

[54] SIGNAL PLAYBACK SYSTEM TRANSDUCER WITH OPTICAL RESONANCE CAVITY

[75] Inventors: Manfred Borner; Gisbert Glasmachers, both of Ulm, Danube; Otto Bernecker, Neu-Ulm, Danube; Volker Riemann, Einsingen; Stefan Maslowski, Aufheim, all of Germany

[73] Assignee: TED Bildplatten Aktiengesellschaft, AEG-Telefunken, TELDEC, Zug, Switzerland

[22] Filed: Sept. 10, 1973

[21] Appl. No.: 395,456

[30] Foreign Application Priority Data

Sept. 8, 1972  Germany............................ 2244119

[52] U.S. Cl. 179/100.3 Z; 178/6.6 DD; 179/100.41 L; 340/173 LS
[51] Int. Cl.².......................................... G11B 11/16
[58] Field of Search............. 179/100.4 R, 100.41 P, 179/100.41 L, 100.3 Z, 100.3 V; 178/6.6 DD; 250/570, 211 J; 340/173 LM, 173 LS

[56] References Cited
UNITED STATES PATENTS

| | | | |
|---|---|---|---|
| 2,654,810 | 10/1953 | Miessner..................... | 179/100.41 L |
| 3,235,672 | 2/1965 | Beguin............................. | 250/570 |
| 3,248,670 | 4/1966 | Dill et al. ..................... | 179/100.3 Z |
| 3,290,539 | 12/1966 | LaMorte ...................... | 179/100.3 Z |
| 3,304,430 | 2/1967 | Biard et al..................... | 179/100.3 Z |
| 3,319,068 | 5/1967 | Beale et al. ................. | 179/100.41 L |
| 3,353,051 | 11/1967 | Barrett et al. ................. | 179/100.3 Z |
| 3,431,513 | 3/1969 | Nannichi....................... | 179/100.3 Z |
| 3,644,740 | 2/1972 | Dobratz et al. .................... | 250/211 J |
| 3,691,317 | 9/1972 | Dickopp....................... | 179/100.41 P |
| 3,691,318 | 9/1972 | Schuller et al. ............. | 179/100.41 P |
| 3,702,465 | 11/1972 | Cricchi............................ | 250/211 J |
| 3,781,550 | 12/1973 | Zeidler............................ | 250/211 J |
| 3,812,477 | 5/1974 | Wieder ........................ | 340/173 LM |

*Primary Examiner*—Stuart N. Hecker
*Assistant Examiner*—Jay P. Lucas
*Attorney, Agent, or Firm*—Spencer & Kaye

[57] ABSTRACT

A pickup system for playing back signals stored on the surface of a carrier in a form providing an optically detectable property which varies as a function of the time pattern of the stored signals, the storage being constituted by undulations or variations in the reflectivity of the carrier surface and the pickup system employing a laser beam which is reflected in a manner controlled by the stored information. The system includes a laser radiation generating element forming part of an optical resonator which also includes the carrier surface so that the intensity of radiation oscillations in the resonator is influenced by the surface and varies as the carrier moves relative to the laser element. The system also includes an output member for converting such intensity variations into an electrical signal representative of the stored signals.

24 Claims, 12 Drawing Figures

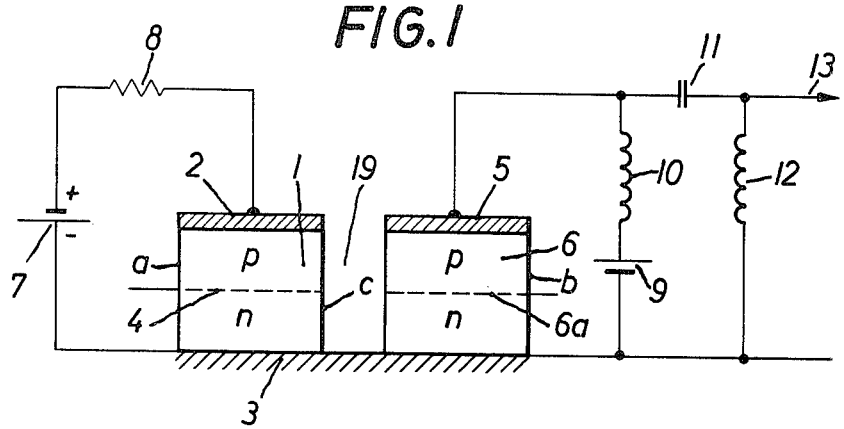
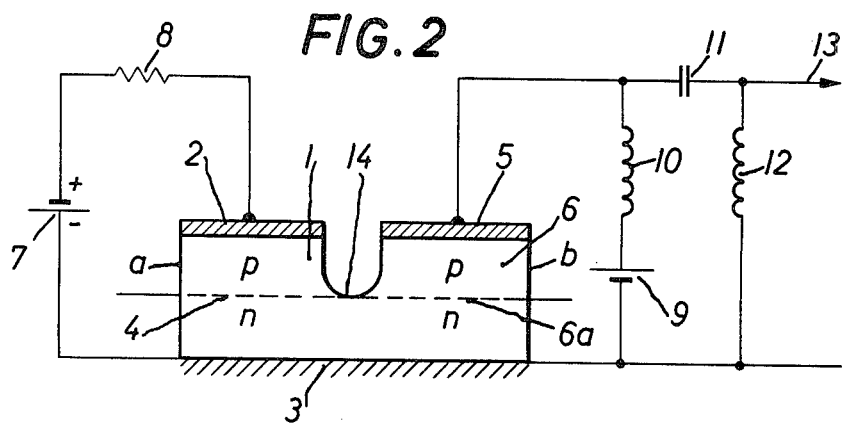
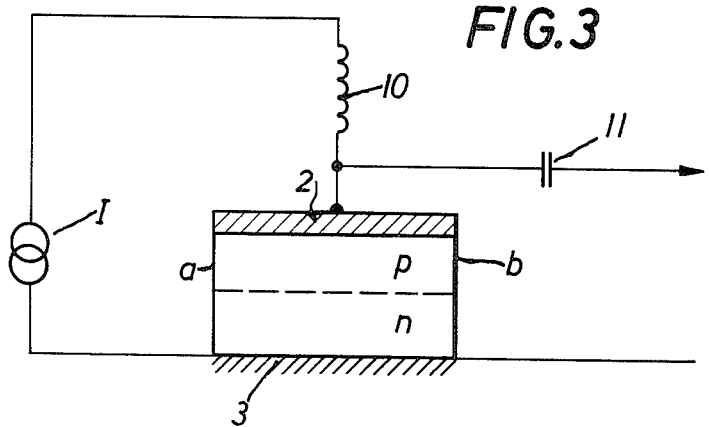

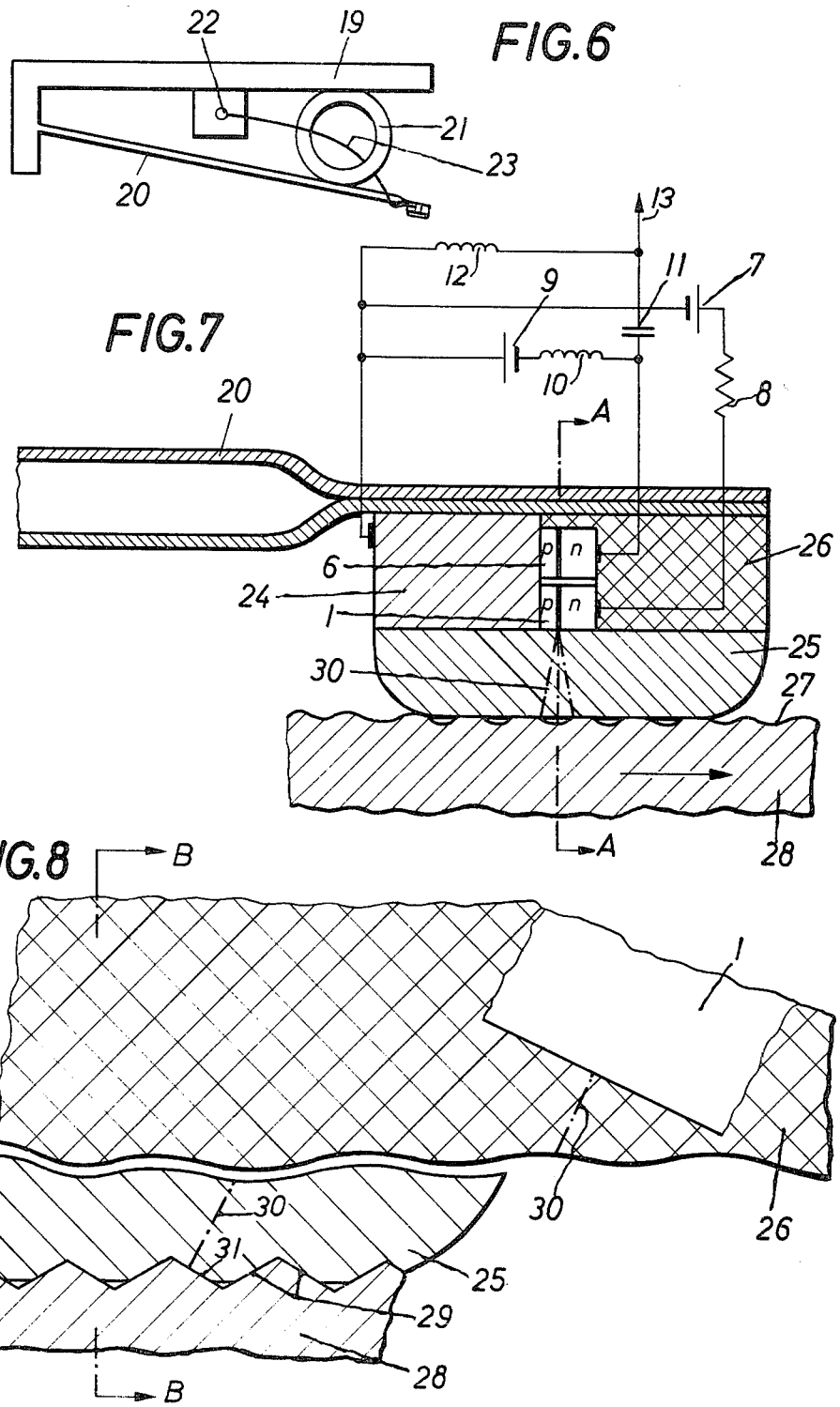

SIGNAL PLAYBACK SYSTEM TRANSDUCER WITH OPTICAL RESONANCE CAVITY

BACKGROUND OF THE INVENTION

The present invention relates to signal reproducing systems, particularly for high frequency signals stored on record discs.

Mechanical pickups are known for scanning disc-shaped record carriers, or picture records, on which television pictures, for example, are stored. In contradistinction to the mode of operation for phonograph record pickups in which the pickup element is deflected by the recorded signal oscillations, the pickup element remains at rest when scanning such picture records and the deformable picture record undulations exert a more or less strong pressure force on the pickup element. The basic picture record arrangement is described, for example, in U.S. Pat. No. 3,652,809, issued to Gerhard Dickopp et al.

In a known device in which the signal track is constituted by undulations in the walls of a groove, the pickup element is an asymmetrical skid whose leading edge, based on its direction of movement relative to the tracks, has a flat shape and whose trailing edge has a steeply ascending shape. Good pickup results are obtained if:

1. the steeply ascending portion of the skid forms an angle of about 90° with the surface of the record and has as small as possible a radius of curvature so that the undulation peaks of the picture record can unimpededly snap upward again when they leave the rear end of the skid; and 2. the contact surface of the skid is not too large in the direction of the groove so that the undulation peaks released behind the rear of the skid can have an increased influence with respect to the proportional change in pressure on the skid upon departure of an undulation peak from contact therewith.

A certain drawback of mechanical pressure scanning is the wear inevitably experienced by the skid, due to which its contact surface becomes wider and its sharp rear edge is worn down. The widening of the skid will have an annoying influence only when the skid no longer rests on the groove wall undulations carrying the recorded information but rather rests on the surface portions outside the groove. The wear on the steep rear edge creates problems much earlier, however.

Methods for scanning record carriers employing light radiation or similar radiation are also known. In this case, the signals are stored in the form of different degrees of darkening of the carrier surface. The quantity of light which is either reflected or transmitted, depending on the degree of darkening, excites a light receiver whose electrical output value constitutes a representation of the signal. There exists the difficulty in the case of this method that copies of the carrier can be obtained only by way of photochemical processes or similar procedures, but not by the simple and inexpensive pressing or stamping process known for fabricating phonograph records.

It is also known to optically scan carriers which contain the signal recording in the form of deformations or undulations on their surface. Difficulty has been encountered in this case in bringing the portion of the light reflected by the surface into an unambiguous relationship to the size and type of deformations involved. This requires complicated optical systems which result in poor utilization of the reflected light. Such systems thus have a low energy utilization efficiency and a low signal to noise ratio.

A system is also known which evaluates the deformations in a picture record, which correspond to the signal values, by means of light radiation, or similar radiation, and a radiation receiver. For this purpose a slit aperture and the surface bearing the deformations are arranged in the path of the beam at such a spacing from one another that in the plane of the slit there results, in dependence on the curvature of the surface bearing the deformations in the direction of the relative speed of the carrier and with respect to the collimated scanning beam, a change in density of the radiation emanating from this surface, which change at least qualitatively represents the path of the curvature. A system of this type is disclosed in German Offenlegungsschrift (Laid Open Application) No. 1,903,822 and in U.S. application Ser. No. 295,011, filed by Gerhard Dickopp on Sept. 29, 1972.

It is known in this connection, in order to maintain the pickup system on a perfect track with respect to the associated signal track and to guide it vertically when the carrier undergoes vertical movements, to provide a guide element which engages, together with a slide element, in a groove of the carrier containing the deformations and includes a member which is optically effective for the particular type of radiation employed and which takes a substantial part in the evaluation of the changes in light density effected by the deformations. This member may be, for example, a slit aperture or a lens as disclosed in U.S. Pat. No. 3,654,401, issued to Gerhard Dickopp.

The previously suggested optical pickup systems, however, have the drawback that when they are used for carriers having a very high storage density the beam cross section must be made so small that it attains the order of magnitude of the wavelength of the radiation. This makes it very difficult to obtain good focussing of the beam due to diffraction phenomena. Thus limits are set for the information storage density.

SUMMARY OF THE INVENTION

It is the object of the present invention to provide less expensive optical systems.

Another object of the invention is to reduce the amount of manual adjustment required for such systems.

A further object of the invention is to permit an increase in the information storage density which can be handled by such systems.

Another object is to provide a system which will experience reduced wear compared to known mechanical scanning systems.

These and other objects are accomplished by a system which incorporates the surface to be scanned in an optical resonator containing a laser medium so that the radiation reflected or scattered by the surface influences the intensity of the light oscillation in the resonator and the intensity of this light oscillation is utilized for reproducing the recorded signal.

Output radiation fed back into a laser resonator is able to influence the output radiation emitted by the laser. Such an influencing of the intensity of the output radiation is possible via the following effects:

1. The quantity of the fed back radiation can influence the energy output. This means, when utilized for the picture record:

a. storage of the information by modulation of the reflection capability, i.e. forming reflecting and nonreflecting spots, in a track:

b. storage of the information by modulation of the surface geometry of the picture record, which permits compatibility with records to be mechanically scanned. A recess, or trough, in the picture record acts approximately like a concave mirror and feeds more light energy back into the laser than does a raised portion, or peak, in the record surface, the latter acting approximately like a convex mirror.

c. storage by combination of (a) and (b).

2. The phase position of the fed back radiation can influence the output energy. Depending on the distance of the surface effecting the feedback, the fed back light energy may be in or out of phase with the standing wave in the laser and can thus effect either constructive interference, which increases the energy output or destructive interference, which reduces the energy output. Consecutive maxima of constructive or destructive interference, respectively, result when the distance between the laser and reflecting surface changes by the optical path length of $\lambda/2$ where $\lambda$ is the laser radiation wavelength. For example, with a GaAs laser and air as the intermediate medium $\lambda/2$ is about 0.45 $\mu$. This effect can be utilized either by itself or in conjunction with that mentioned above under (1.b) for the scanning of picture records.

For example, additional information can be stored on a picture record by giving the relief-type recesses varying depths.

The feedback producing picture record surface to be scanned may also form, together with the frontal face of the laser, an optical resonator which is coupled to the actual laser resonator. The quality of this resonator and particularly its optical length will not only influence the intensity in the laser resonator but also the emitted mode spectra. Under certain circumstances, changes in the mode spectrum can be used for the signal derivation during scanning.

The advantage of the scanning method according to the present invention compared to the above-mentioned known optical scanning methods is that it is not the laser radiation reflected at the picture record surface which is used directly for detection, but rather the scattered or reflected laser light itself which influences the laser oscillation as it is generated.

This is advantageous in that no measures need be taken to focus the laser radiation or to form partial beams, since only the backscattered component of the laser light which is correctly fed back into the waveguide structure automatically contributes to an influence on the laser oscillation during its generation.

BRIEF DESCRIPTION OF THE DRAWINGS

FIG. 1 is a partly pictorial circuit diagram of one embodiment of a pickup according to the invention.

FIG. 2 is a view similar to that of FIG. 1 of another embodiment of a pickup, including a combined laser and detector diode.

FIG. 3 is a circuit diagram of another embodiment of a pickup which has no detector diode and which is supplied by a constant current source.

FIG. 6 is an elevational view of a complete pickup arrangement according to the invention.

FIG. 7 is a longitudinal cross-sectional view of a pickup and associated electrical circuit elements according to the invention.

FIG. 8 is a cross-sectional detail view taken along line A—A of FIG. 7 and showing parts of the pickup shown in FIG. 7.

DESCRIPTION OF THE PREFERRED EMBODIMENTS

Figure 4:
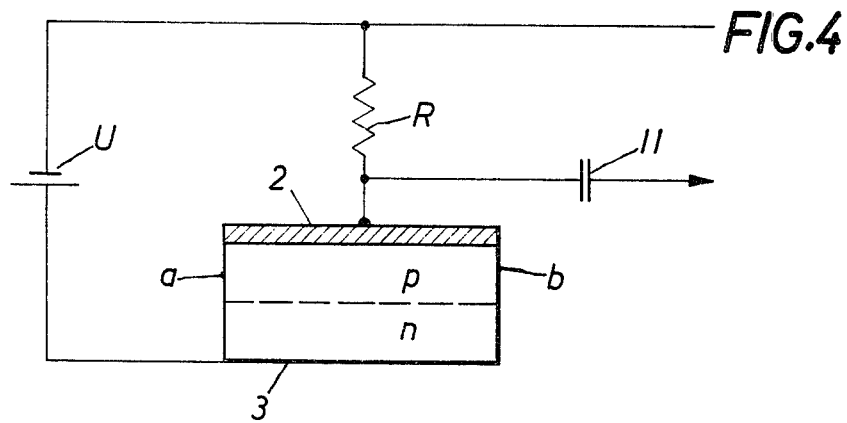
FIG. 4 is a circuit diagram of another embodiment of a pickup which has no detector diode and which is supplied with a constant operating voltage.

FIG. 1 illustrates the principle of an embodiment of a waveguide structure according to the present invention which is excited by a laser diode 1, preferably a semiconductor laser diode. Conductive contact is established between the contact surface 2 and the metallized basic surface 3 and a suitable voltage between these contacts causes light to be generated in pn-junction 4.

Light fluctuations may be produced, for example, by fluctuations in the intensity of the light reflected from the picture record surface into the waveguide structure during scanning of the picture record. These fluctuations can be detected by a semiconductor photodiode 6 having electrodes 5 and 3. The laser diode 1 and photodiode 6 have the metallized base surface 3 as their common contact. The light-sensitive layer of the photodiode is constituted by the pn-junction 6a.

Laser diode 1 is fed, for example, by a voltage source 7 via a bias resistor 8 and is biased in the forward direction.

The photodiode 6 is electrically supplied by a voltage source 9 which applied a blocking voltage to the photodiode via a choke coil 10.

The choke coil blocks flow of the HF signals generated by the photodiode. These signals are conducted through the coupling capacitor 11 to the output lead 13 for further processing. Between output 13 and coupling capacitor 11 low frequency components are conducted to ground via inductance 12, so that the coupling capacitor 11 and this last mentioned inductance 12 from a highpass filter.

The light exit and entrance for the picture record to be scanned takes place via the surface a of the laser diode 1. The waveguide structure of this arrangement, in which laser diode 1 and photodiode 6 are separated by a slit 19 which is only a few microns ($\mu$) wide, extends only to the surface c of the laser diode. The light emanating from surface c is used to provide a measurement of the light energy present in the waveguide structure or, respectively, its fluctuations due to the time modulated feedback from the picture record to be scanned. This measurement is performed with the aid of the photodiode 6.

If, to simplify construction, a larger spatial separation is desired between semiconductor laser 1 and detector diode 6, the optical connection between these two components can be effected by a further optical waveguide, for example a glass fiber. In this case any other desired type of optical-electrical transducer can be used instead of the proposed transverse radiation photodiode 6.

The semiconductor materials to be used are any substances and structures known in connection with lasers and photodiodes, in addition to gallium arsenide and gallium aluminum arsenide. For example, a silicon multiple layer structure can be used as well.

FIG. 2 shows the basic composition of a further embodiment of a scanning arrangement according to the present invention, where the laser diode 1 and the photodiode 6 are formed in a common semiconductor body, i.e. the laser diode and photodiode have their n-type conductivity semiconductor part in common, for example. The p-type conductivity semiconductor parts, separated from the n-type semiconductor part by the pn-junctions 4 and 6a, are electrically insulated from one another by a slit 14. This is necessary, because contacts 2 and 5 are at different voltage potentials.

In this embodiment, in which the waveguide structure extends from surface a to surface b, the light enters from, and exits toward, the picture record to be scanned again through surface a of the laser diode. In order to improve the optical, or light utilization, efficiency, surface b should be made mirrorlike, so that no light can emanate therefrom and so that as much radiation energy as possible is available for the actual scanning process. It would also be possible, however, to have the light emanate from surface b, in which case surface a should then be made reflective instead of surface b and surface b would be directed toward the carrier.

With additional doping of the pn-junction in the receiving diode 6 and/or the laser diode 1, it is possible to reduce the attenuation of the light present in the waveguide structure.

An increase in the sensitivity of the light detector is attained when the photodiode is constructed as an avalanche photodiode. These diodes utilize internal current multiplication for increasing the sensitivity.

There exists an optimum sensitivity value when these diodes are used in the system of the present invention. This optimum can be automatically obtained, according to a further embodiment of the present invention, if the direct injection current for the semiconductor laser is modulated, for example at a frequency of 50 Hz. It is then possible to derive, in a known manner, a control voltage for the optimum setting of the avalanche bias and/or the direct injection current via an additional filter connected in parallel with the highpass filter which, when used in the picture record playback instrument, must permit only frequencies above 100 kHz to pass.

The semiconductor materials to be used are any substances and structures known in connection with laser diodes.

For example, a GaAs-Al$_x$Ga$_{1-x}$As double heterostructure junction laser may be used. Structures of such a kind and doping ingredients are described in an article entitled "GaAs-Al$_x$Ga$_{1-x}$As Double Heterostructure Injection Lasers" by I. Hayashi et al. in the Apr. 1971 publication of Journal of Applied Physics, Volume 42, Number 5, pages 1929 – 1941. Here the same structure is used for the photodiode, too.

Figure 10:
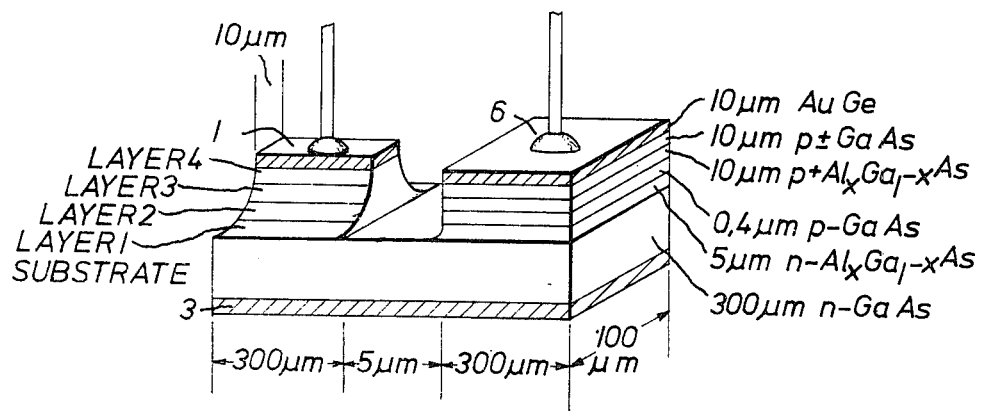
FIG. 10 is a pictorial view of one exemplary operative embodiment of a laser-photodiode structure according to the invention, where the dimension of the semiconductor body and of the layers and the nature of the semiconductor material are specified.

FIG. 10 shows an exemplary operative embodiment of a laser-photodiode structure according to the invention, including the nature of the semiconductor material and the dimension of the semiconductor body, for example. The diodes 1 and 6 are fabricated in a single run. During the last working step the slit 14 is prepared by an etching method in a manner known per se. Preferably the laser diode is fabricated in a strip geometry as shown.

A suitable power supply on the one hand for the laser diode is a laser current about 100 m A, for example derived from a source of a voltage of 5V via a bias resistor of 50Ω, and on the other hand for the photodiode is a blocking voltage 9 of about 5 V. The wavelength of the GaAs laser diode is about 0,850 μm.

The mean distance between surface a, shown in FIG. 2, and the record carrier surface is about 10 – 50 μm, but also smaller distances are possible.

Figure 11:
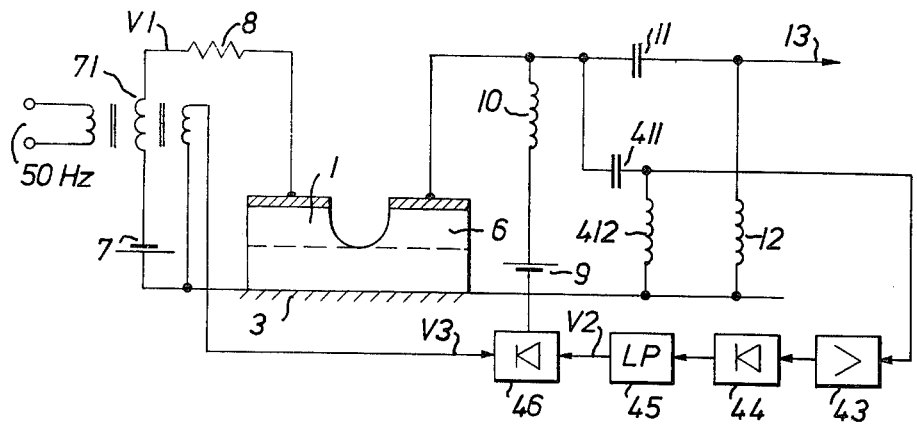
FIG. 11 is a circuit diagram of one embodiment for modulating and optimum value setting control system, where the optimum value setting control system is shown in manner of a block diagram.

FIG. 11 illustrates an embodiment of the modulating and optimum value setting control system. For this example a scanning arrangement is chosen according to FIG. 2 Laser diode 1 and photodiode 6 are formed in a common semiconductor body. The direct injection current for the laser diode is modulated by means of an alternating voltage V1 at a frequency of 50 Hz produced by one secondary coil of a transformer 71 connected between the voltage source 7 and the bias resistor 8.

Via an additional filter connected in parallel with the highpass filter 11, 12, the additional filter consisting of the coil 412 and the capacitor 411, and an amplifier 43, a rectifier 44 and a lowpass filter 45 an alternating voltage V2 at the frequency of 50 Hz is produced voltage V2 being derived from the output of photodiode 6 which is in response to the modulated beam of the laser diode.

The time constant of the lowpass filter 45 is approximately 10 ms.

The output voltage V2 of the lowpass filter 45 is phasesensitive rectified in the rectifier 46 by means of the reference voltage V3 from a further secondary of the transformer 71.

The output voltage of the phase-sensitive rectifier gives the control voltage for controlling the bias voltage of the diode 6.

Figure 12:
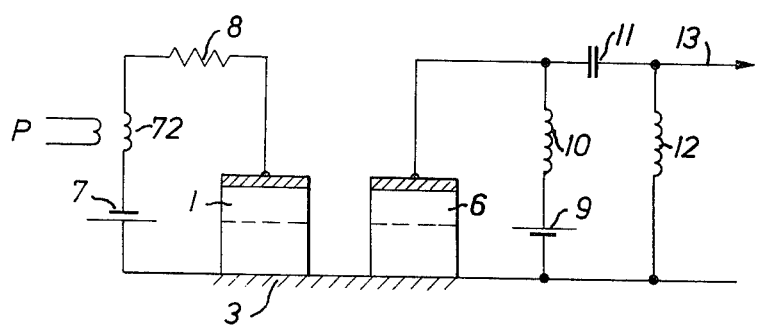
FIG. 12 is a circuit diagram of one embodiment of a pulse operating arrangement.

FIG. 12 shows an example of an embodiment of the pulse operating arrangement. Between the voltage source 7 and the bias resistor 8 a pulse transformer 72 is connected. The bias current for the laser diode is approximately as high as the threshold current of the laser diode. The pulse transformer 72 is the source of an additional pulse current for exciting a light pulse emission of the laser diode. The pulse form is rectangular shaped (FIG. 12 above) and preferably the repetition frequency is twice the highest frequency to be recognized as information stored in the surface of the record disc.

In order to obtain optimum effects from the light reflected at the surface of the picture record with respect to the laser oscillation building up in the waveguide structure, the entrance and exit surface of the waveguide structure facing the picture record may be modified in its reflection capability, for example it can be made nonreflective by use of an antireflective layer known per se.

A further embodiment of the present invention is one in which the detector is completely eliminated. This embodiment makes use of the face that fluctuations in the light energy present in the semiconductor laser produce a corresponding reaction in the electrical forward resistance of the laser.

FIGS. 3 and 4 show circuits for the case where such varying forward resistance of the light emitting laser is used for effecting detection, this forward resistance changing in dependence on the intensity of the reflected light.

In FIG. 3 the laser diode is operated by a constant current from a current source I and the voltage fluctuations at electrode 2 are detected via coupling capacitor 11. The choke 10 is connected in series with the current source and presents a highly ohmic resistance to the signal current.

In the embodiment shown in FIG. 4, the laser diode is fed by a constant voltage source U via a resistor R and the desired signal voltage is obtained via coupling capacitor 11.

Figure 5:
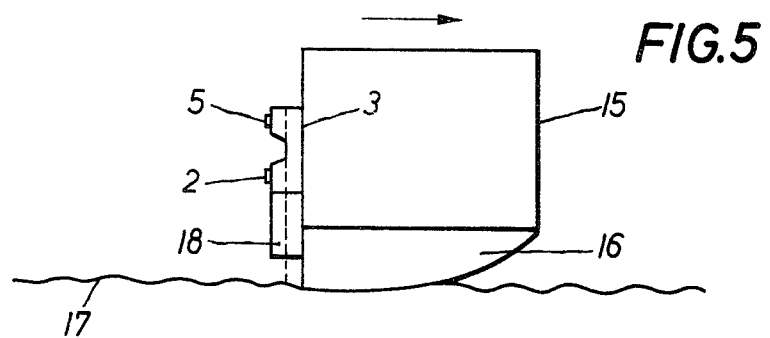
FIG. 5 is a pictorial view illustrating the arrangement of a waveguide structure according to the present invention at the scanning skid of a picture record player.

FIG. 5 shows the waveguide structure according to the present invention in use for picture record scanning. For example, the system including the laser and photodiode, which has essentially the form shown in FIG. 2, is here attached to the rear edge of a mount 15 for a scanning, or pickup, skid 16. The pickup moves in the direction of the arrow, i.e. from the left to the right in the illustrated embodiment, relative to the picture record surface 17. In practice, of course, skid 16 and mount 15 are stationary and surface 17 moves in the direction opposite to that indicated by the arrow.

The optical coupling of the waveguide structure can be effected directly to the picture record, or, as shown in FIG. 5, via a glass fiber line 18. The scanning of the signal stored in the picture record may take place in the same groove in which the skid moves. However, it is more advantageous to optically scan one of the adjacent grooves which has just been traversed by the skid since these will have just been cleaned of impurities by the advancing skid and the structure of such adjacent groove will have reassumed its original shape.

The pressure of the skid on the picture record may be less than, for example, half as much as, that required for pressure scanning. This also reduces wear on the skid. Moreover, the skid is no longer required to have a steep trailing edge. However, the same carriers can be scanned by the method according to the present invention and by the pressure scanning method. Such carrier is intended to rotate for example at 1500 revolutions per minute during scanning, and is provided with a helical groove which is to be scanned according to the pressure scanning technique with a skid contact pressure of approximately 0.15 to 0.2 pond (= gram force). This carrier has at its surface a groove which may be 3.5 $\mu$ wide, the groove walls being formed with undulations which have wavelengths of about 2 to 4 $\mu$ and amplitudes of about 0.1 $\mu$.

In the system according to the present invention, the guide element can be a diamond skid similar to that used in the practice of the pressure scanning method. The length of this skid can, for example, be 200 $\mu$, and its height is 70 $\mu$. The skid has a wedge-shaped cross section with a rounded portion which is adapted to size and shape of the groove.

The groove may have a triangular groove profile, with its sides enclosing an angle of 135°, for example.

The dimensions of the guide element, however, are not as critical, when the longitudinal profile is not symmetrical or when there is no contact with the undulations on the carrier surface, as in the pressure scanning technique because the undulations do not lead to an excitation of mechanical oscillations.

FIG. 6 is an overall view of an embodiment of the pickup system according to the present invention. In a housing 19 there is fastened an aluminum tube 20 whose free end is flattened. The flattened end is provided with a pickup member provided with an optical structure having the form shown in one of FIGS. 1 through 4, which member is connected with a track guide member. In order to damp mechanical oscillations resulting from rotational eccentricities and/or wobbling of the carrier, a damping ring 21 is attached to the tube 20 and clamped in housing 19. One of the electrical leads for the pickup member is formed by tube 20, while a wire 23 constituting a second lead is connected to an electrical support point 22. Connecting lines from tube 20 and from the supporting point 22 to suitable connecting terminals are not shown.

FIG. 7 shows in detail, the free end of tube 20 of FIG. 6 carrying a laser diode 1 and photodiode 6 similar to those shown in FIG. 1 for example and a groove guide element 25, shown in longitudinal section, the components being shown to an enlarged scale compared with FIG. 6. The laser employed in this case is preferably a GaAs-GaAlAs dual heterostructure laser.

Laser diode 1 and photodiode 6 are embedded in a casting mass 26, for example of epoxy resin, which connects the free end of the tube 20 with the diamond track guide element 25. A heat dissipation element 24, for example of copper, is disposed between tube 20 and element 25. The outline of the edge of guide element 25 which contacts the undulations 27 along the groove in carrier 28 is symmetrical in its longitudinal section with respect to cross section line A.

The laser beam 30 emanating from laser diode 1 travels through guide element 25 either to one of the contact surfaces between the guide element and the undulations 27 or out of the guide element and onto one of the interstices between the raised undulations 27. In both cases there result varying reflection values for the laser radiation. In the absence of undulations, laser radiation would be reflected from the interface between the diamond and air back to the laser diode 1. This radiation would have a constant travel path through the diamond and back, and thus a constant travel time.

When the track guide element 25 is placed against the undulations 27, the reflection is reduced at those points where the guide element is in contact with the undulations. At the interstices, or troughs, between the points of contact, however, the reflection at the diamond/air interface remains intact, but a further reflecting component from the picture record surface is added. It is here particularly advantageous that the radiation lobe pattern of the laser radiation remain narrower in a diamond with a high diffraction power than in air so that stronger feedback and better local resolution of the undulations 27 is possible during scanning.

The electrical circuit of the pickup is analogous to that shown in FIG. 1 and the electrical signal obtained at terminal 13 corresponds to the signal stored on carrier 28.

In order to for the impingement on the modulated groove wall by the laser beam to be as perpendicular as possible the waveguide structure is mounted in an inclined position in the guide element 25.

FIG. 8 is a cross-sectional view taken along line A—A of FIG. 7. The section line B—B defines a plane parallel to that of FIG. 7. While FIG. 7 shows that the undulations are not flattened to any marked extent by the guide element 25, FIG. 8 shows the manner in which the guide element 25 rests on the sides, or walls, of a plurality of the grooves in carrier 28. Resting on but one groove would already reduce wear on the guide element, compared to that occurring during the known pressure scanning technique, since the contact force is reduced. However, since in the pickup system according to the present invention the track guide element can rest on a plurality of grooves without creating difficulties, wear can be further reduced by the thus enlarged contact surface and the resulting reduction in contact pressure with the same contact force. The laser beam, which in FIG. 8 is also indicated at 30, impinges on but one groove side, or wall, 31, which is shown in section in FIG. 7.

Figure 9:
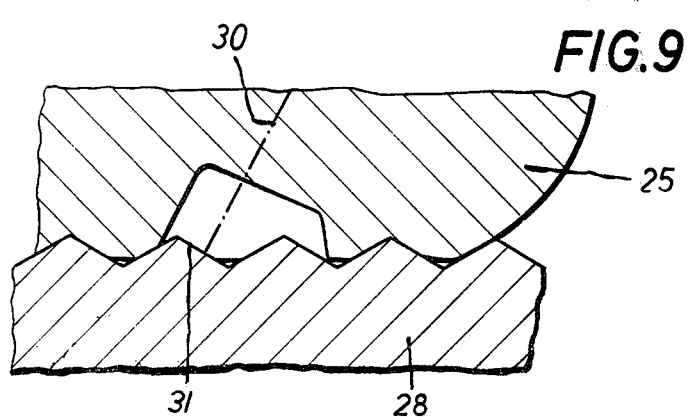
FIG. 9 is a detail view of a variation of the arrangement shown in FIG. 8.

FIG. 9 shows a modification of the arrangement of FIG. 8 in which, during scanning, the guide element rests only on the surface portions of the carrier 28 which are at that instant not being scanned, and thus does not rest on the groove wall 31 which is being scanned. Here the movement of the carrier 28 in a direction perpendicular to the plane of the figure results in the laser beam 30 being alternatingly converged and diverged, or scattered, by a recess and a raised portion, respectively, on the groove wall 31 similarly to the result produced by adjacent concave and convex mirrors. Thus the quantity of reflected light, and hence the degree of feedback, fluctuates.

Compared to the pressure scanning method the track guide body can be made wider and/or longer so that abrasion due to friction is reduced because of the consequently reduced contact pressure. A larger contact length does not impair the signal to noise ratio and does not lower the frequency limit.

In order to increase the lifetime of the optical resonator and/or the signal to noise ratio of the output signal, it is advantageous for the optical resonator which contains the laser medium to be operated in a pulsating manner.

This results in the advantage that the number of operating hours for the pickup system is increased and that the electrical sensitivity of the system can be increased as well.

According to the scanning theorem, the pulse repetition frequency must be twice as high as the upper frequency limit of the information recorded on the picture record. Pulse durations which can still be processed well by the semiconductor laser diode extend from about one nanosecond to several nanoseconds.

The signal to noise ratio in the receiving diode or in the injection current to be measured in order to detect the information can be improved by increasing the pulse energy up to an order of magnitude of 1 W.

The system according to the present invention can be used with longer, preferably single mode glass fiber lines to solve measuring and scanning problems at points which are less easily accessible. For example, the roughness of surfaces or the amount by which rotating shafts are out of round, and the like, can be determined in this way.

The embodiments of the present invention have been described for the case where the surface of the recording carrier is provided with spatial undulations which correspond to the recorded information.

The record carrier material may be the usually used material for mechanical pressure scanned picture record discs. For example a suitable material is PVC-plastics (Polyvinylchloride). In order to improve the optical properties the carrier surface may be made reflective by aluminizing in vacuum.

However, the present invention can also be used in cases where the information is recorded on the carrier surface in the form of modifications of its reflection capability. For example, one such case would be the storage of information in the form of holes formed in a reflecting surface of the carrier.

It will be understood that the above description of the present invention is susceptible to various modifications, changes and adaptations, and the same are intended to be comprehended within the meaning and range, of equivalents of the appended claims.

We claim:

1. A pickup system for playing back wide-band signals stored on the surface of a carrier in the form of surface deformations extending along a recording track and capable of reflecting laser radiation in a manner which varies as a function of the time pattern of the stored signals, comprising: laser means for producing laser radiation and arranged to be positioned to form, during playback, an optical resonator with the carrier surface such that when said laser means are in operative association with the surface the intensity of the laser radiation oscillations produced by said laser means is influenced by the radiation relfected back to said laser means by the surface and varies as a function of variations in the reflection or scattering of laser radiation back into said laser means from said carrier surface when said laser means undergoes relative movement along the recording track; and output means for converting such intensity variations in the radiation produced by said laser means into an electrical signal representative of the stored signals.

2. Pickup system as defined in claim 1 wherein the signals are stored on the carrier surface in the form of spatial undulations.

3. Pickup system as defined in claim 1 wherein the signals are stored on the carrier surface in the form of reflectivity variations.

4. Pickup system as defined in claim 1 wherein the intensity of the laser radiation oscillations in said resonator is a function of the quantity of laser radiation fed back by said resonator.

5. Pickup system as defined in claim 1 wherein the intensity of the laser radiation oscillations in said resonator is influenced by the relative phase position of the laser radiation fed back from the carrier surface by said resonator.

6. Pickup system as defined in claim 1 wherein said optical resonator comprises a light waveguide structure including a semiconductor laser diode, and said output means comprises a semiconductor diode arranged to detect the radiation oscillations produced by said laser diode, and means biasing said output means semiconductor diode for operation in its blocking direction, and wherein said output means semiconductor diode is combined with said semiconductor laser diode.

7. Pickup system as defined in claim 6 wherein said output means semi-conductor diode has a pn-junction which is doped to create low attenuation of the radiation oscillations present in said resonator.

8. Pickup system as defined in claim 1 wherein said optical resonator comprises a light waveguide structure including a semiconductor laser diode, and said output means comprises an optical-electrical transducer arranged to detect the radiation oscillations, said transducer being separate from said optical resonator.

9. Pickup system as defined in claim 8 comprising a further light waveguide disposed for feeding the oscillations emanating from said optical resonator to said transducer.

10. Pickup system as defined in claim 9 wherein said further light waveguide is constituted by a glass fiber.

11. Pickup system as defined in claim 1 wherein said output means comprises an avalanche diode optically linked to said laser means.

12. Pickup system as defined in claim 1 wherein said laser means comprises a semiconductor laser diode and said output means comprises a semiconductor photo diode arranged to detect the radiation oscillations, further comprising: first supply means connected to apply a direct injection current to said laser diode for producing laser radiation; modulating means connected to modulate the current provided by said first supply means; second supply means connected to bias said photo diode; control signal generating means including a low pass filter and connected to the output of said photo diode for deriving a control signal from the electrical signal produced by said photo diode; and optimum value setting means connected between said generating means and at least one of said supply means for enabling said control signal to establish optimum operating conditions for the respective diode associated with said supply means.

13. Pickup system as defined in claim 1 wherein said laser means comprises a laser diode and said output means is defined by the electrical forward resistance of said laser diode, which is a function of the radiation oscillation in said laser diode, and comprises a sensing circuit connected to said laser diode.

14. Pickup system as defined in claim 13 further comprising supply means connected to deliver a constant current to said laser diode to cause it to generate laser radiation, and said sensing circuit derives a signal representative of the voltage across said laser diode.

15. Pickup system as defined in claim 1 wherein said laser means comprises a laser diode and further comprising a constant voltage source connected to apply operating current to said diode, and wherein said output means produces an electrical signal representative of the current fluctuations in said diode resulting from fluctuations in the intensity of the radiation oscillations in said resonator.

16. Pickup system as defined in claim 1 wherein said laser means comprises a light waveguide contained in said optical resonator and having a surface arranged to be directed away from the carrier formed to have the reflective properties of a mirror.

17. Pickup system as defined in claim 1 wherein said laser means comprises a light waveguide contained in said optical resonator and having a surface arranged to be directed toward the carrier formed to be substantially nonreflecting.

18. Pickup system as defined in claim 1 further comprising power supply means connected to operate said laser means in a pulsating manner.

19. Pickup system as defined in claim 1 wherein the signals are stored on the walls of a groove formed on the carrier surface and further comprising groove guide means carrying said laser means and output means and arranged to move along, and be guided by the groove.

20. Pickup system as defined in claim 19 wherein said laser means and output means are mounted for scanning the groove portion directly behind said guide means, with respect to the direction of movement of said guide means along the groove.

21. Pickup system as defined in claim 19 wherein the groove has a spiral form composed of a succession of adjacent turns and said laser means and output means are mounted for scanning a groove turn which has previously been traversed by said guide means.

22. Pickup system as defined in claim 19 wherein the signals are stored in the form of spatial undulations on the groove walls and said guide means are transparent to the laser radiation and are shaped and mounted to move along the groove without producing any marked compression of the undulations, and wherein said laser means and output means are mounted so that they are to one side of said guide means and the carrier surface is to the opposite side of said guide means.

23. Pickup system as defined in claim 22 wherein said guide means are formed to rest only on groove portions which are momentarily not being scanned by said laser means.

24. A signal playback system comprising:
a record carrier provided with stored signals to be played back, the signals being in the form of surface deformations extending along a recording track and capable of reflecting laser radiation in a manner which varies as a function of the time pattern of the stored signals
laser means for producing a laser beam and positioned, during playback, relative to said carrier so as to form an optical resonator with said carrier surface such that laser radiation produced by said laser means is reflected back to said laser means from said carrier surface to influence the intensity of the output radiation produced by said laser means, the laser radiation being produced by said laser means thus varying in intensity as a function of variations in the reflection or scattering of laser radiation back to said laser means from said carrier surface as said laser means undergoes relative movement along said recording track; and
output means connected for converting such intensity variations in the radiation produced by said laser means into an electrical signal representative of the stored signals.

* * * * *